(12) United States Patent
Kondo et al.

(10) Patent No.: US 7,321,194 B2
(45) Date of Patent: Jan. 22, 2008

(54) DISPLAY DEVICE WITH PROTECTIVE FILM OVER DISPLAY REGION

(75) Inventors: Shigeki Kondo, Hiratsuka (JP); Hidemasa Mizutani, Sagamihara (JP); Masahiro Fushimi, Zama (JP); Seishi Miura, Sagamihra (JP); Takashi Moriyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 10/530,896

(22) PCT Filed: Oct. 9, 2003

(86) PCT No.: PCT/JP03/12978

§ 371 (c)(1),
(2), (4) Date: Apr. 11, 2005

(87) PCT Pub. No.: WO2004/040945

PCT Pub. Date: May 13, 2004

(65) Prior Publication Data

US 2006/0028133 A1    Feb. 9, 2006

(30) Foreign Application Priority Data

Oct. 30, 2002    (JP) .............................. 2002-315328

(51) Int. Cl.
*H05B 33/00* (2006.01)
(52) U.S. Cl. .................... 313/504; 313/498
(58) Field of Classification Search ......... 313/498–512
See application file for complete search history.

(56) References Cited

U.S. PATENT DOCUMENTS

| | | | | |
|---|---|---|---|---|
| 5,686,360 A | 11/1997 | Harvey, III et al. | ........ | 437/211 |
| 5,757,126 A | 5/1998 | Harvey, III et al. | ........ | 313/506 |
| 6,812,497 B2 | 11/2004 | Kamatami et al. | ............ | 257/79 |
| 2002/0036462 A1 | 3/2002 | Hirano | ........................ | 513/506 |
| 2002/0057055 A1 | 5/2002 | Yamazaki et al. | ........... | 313/506 |
| 2002/0093285 A1 | 7/2002 | Sugimoto et al. | ........... | 313/506 |
| 2004/0013905 A1 | 1/2004 | Tsuboyama et al. | ........ | 428/690 |

FOREIGN PATENT DOCUMENTS

| | | |
|---|---|---|
| EP | 00 777280 B1 | 9/2001 |
| EP | 1 191819 A2 | 3/2002 |
| JP | 09-161967 | 6/1997 |
| JP | 10-189252 | 7/1998 |
| JP | 2000-277280 | 10/2000 |
| JP | 2002-356711 | 12/2001 |
| JP | 2002-100469 | 4/2002 |
| JP | 2002-203682 | 7/2002 |

*Primary Examiner*—Joseph Williams
(74) *Attorney, Agent, or Firm*—Fitzpatrick, Cella, Harper & Scinto

(57) ABSTRACT

In a display device having a display region formed by disposing a plurality of organic light emitting elements such as organic EL elements, it becomes possible to prevent penetration of water into the display region to suppress degradation in display characteristics even during drive over a long period of time and to improve long-term reliability. There is provided a display device comprising a display region (120) having a plurality of organic light emitting elements disposed on a substrate (101), each of the plurality of organic light emitting elements having an organic layer (103 comprising a light emitting layer interposed between an anode and a cathode (102, 104), wherein the display region (120) is formed on a first insulating protective layer (106) provided on the substrate (101), and a surface on a side opposite to a substrate (101) side and an entire periphery of the display region (120) are covered with an insulating protective film (107).

11 Claims, 2 Drawing Sheets

DISPLAY DEVICE WITH PROTECTIVE FILM OVER DISPLAY REGION

TECHNICAL FIELD

The present invention relates to a display device and, more particularly, to a display device which uses an organic light emitting element such as an organic electroluminescent element as a display element, and which is suitable for an active-matrix organic electroluminescent display or the like.

BACKGROUND ART

Organic electroluminescent elements using electro-luminescence (hereinafter referred to as EL) of an organic material are formed by stacking organic layers, i.e., an organic carrier transport layer and an organic light emitting layer, between an anode and a cathode, and attract attention as a light emitting element capable of high-luminance emission by low-voltage direct-current drive.

The development of active-matrix display devices having thin-film transistors (hereinafter referred to as TFTs) for driving organic EL elements for pixels among display devices using the above-described organic EL elements has been pursued particularly energetically by considering their high-image-quality and long-lifetime characteristics.

FIG. 5 is a schematic perspective view of an active-matrix organic EL display device. Display pixels 502 are disposed in a matrix form on a substrate 501, and a pixel circuit for driving an EL element for each pixel is contained. A drive circuit 503 for driving each pixel is also contained on the periphery of the array of the pixels. These circuits are constituted by TFTs and wiring and are connected to external circuits through external lead terminals 504 to be driven. Ordinarily, upper surfaces of the pixel portion 502 and the drive circuit 503 are covered with a sealing member 505 such as a glass or metal plate bonded to the substrate 501 by an adhesive 506 to maintain a mechanical strength.

In the display device thus constructed, a flattening insulating film is provided in a state of covering the TFTs and wiring provided on the substrate, and organic EL-elements are provided on this flattening insulating film. The organic EL elements and the wiring are connected to each other via contact holes formed in the flattening insulating film.

As an example of the flattening insulating film, one formed by applying a resin material such as polyimide by spin coating is used as disclosed in Japanese Patent Application Laid-Open No. H10-189252 (patent document 1).

With this display device, however, there is a problem described below.

That is, the flattening insulating film formed by application such as spin coating has a high water absorbing property because it is made mainly of an organic material or contains an organic material. For example, a water absorption coefficient of a polyimide film formed by application of a commercially available coating liquid is up to 1 to 3%. Since the light emitting portion of the organic EL element used as a display element is made of an organic material, a disadvantage such as a reduction in luminance intensity or an increase in drive voltage can occur easily therein by absorption of water. In a case where a material having a high water absorbing property is used as the flattening insulating film as described above, therefore, water gradually released from the flattening insulating film seriously affects the display performance of the display element, resulting in failure to enable the display device to have long-term reliability. Because degradation of the display element by absorption of water proceeds even during the process of manufacturing the display device, the release of water from the flattening insulating film is also a cause of a reduction in yield of the display device.

To solve the above-described problem, an arrangement such as disclosed in Japanese Patent Application Laid-Open No. 2001-356711 (patent document 2), for example, has been proposed in which a coat layer 6b made of an inorganic material is formed on the surface of a flattening insulating layer 6a as a barrier against water released from an organic material constituting the flattening insulating layer 6a and other impurity gas components (see FIG. 6).

In the display device shown in FIG. 6, TFTs 2 of the bottom gate type (which may alternatively be of the top gate type) are provided in a matrix form on a substrate 1 made of a glass material, for example, and an insulating film 3 is formed in a state of covering the TFTs. On this insulating film 3, wiring 4 connected to the TFTs 2 via connection holes not illustrated is provided on the insulating film 3.

On the insulating film 3 is also provided an interlayer insulating film 6, the wiring 4 being embedded in the interlayer insulating film 6. The interlayer insulating film 6 is provided in a multilayer structure formed of a flattening insulating layer 6a and a coat layer 6b provided on the flattening insulating layer 6a. The flattening insulating layer 6a is formed of a material obtained by using an organic material such as SOG (Spin-on-Glass) or a resin material (e.g., a polyimide resin, an acrylic resin, or an organic silica film). The flattening insulating layer 6a is an applied film formed by an application method such as spin coating. The coat layer 6b is formed by using an insulating material having a gas barrier property such as to be capable of limiting the release of a gas from the flattening insulating layer 6a. An inorganic material such as silicon oxide, silicon nitride ($Si_3N_4$), amorphous silicon ($\alpha$-Si) or aluminium oxide ($Al_2O_3$) is used to form the coat layer 6b in a single-layer or multilayer structure. The coat layer 6b has such a film thickness as to be capable of sufficiently effectively suppressing the release of a gas from the flattening insulating layer 6a.

In the interlayer insulating film 6 formed in such a multilayer structure, connection holes 7 reaching the wiring 4 are provided. Side peripheral walls of the connection holes 7 are covered with the coat layer 6b, and the upper surface of the flattening insulating film 6a and the surface facing the interior of each connection hole 7 are completely covered with the coat layer 6b.

Organic EL elements 10 are provided on the interlayer insulating film 6 in a state of being connected to the wiring 4. The organic EL elements 10 are, for example, of an upper-surface emission type such that an emitted light radiates from the side opposite to the substrate 1 side and are each constituted by a lower electrode 11 connected to the wiring 4 via the connection hole 7, an insulating layer 12 provided in a state of covering a peripheral edge of the lower electrode 11, an organic layer 13 provided on the lower electrode 11, and an upper electrode 14 and a transparent electrode 15 provided on the organic layer 13. The organic EL elements 10 may alternatively be of a transmission type such that light is taken out from the substrate 1 side.

The device is thus arranged to suppress the release of water from the flattening insulating film to the organic EL elements and to prevent degradation of the organic EL elements due to absorption of water during drive over a long time period.

(Patent document 1)
Japanese Patent Application Laid-Open No. H10-189252

(Patent document 2)
U.S. patent application Publication No. US2002/036462A1

Even an arrangement such as shown in FIG. 6 also has a problem described below.

As described above, the arrangement shown in FIG. 6 is effective in preventing penetration (or permeation) of water into the upper organic EL elements from the flattening insulating film (indicated by arrow 21 in FIG. 6). In designing the actual device construction, however, other water penetration paths that should be considered exist, and which are also shown in FIG. 6. That is, penetration of water from the flattening insulating film at a display region end surface (indicated by arrow 22 in FIG. 6), penetration of water from contacting atmosphere (indicating arrow 23 in FIG. 6), penetration of water from contacting atmosphere from the upper surface of the display region (indicated by arrow 24 in FIG. 6) and the like are taken into consideration. Further, the interpixel insulating layer 12 formed between adjacent pixels for the purpose of preventing short-circuit between the lower (pixel) electrodes and the upper electrodes is made mainly of an organic material or contains an organic material, as does the flattening insulating film. Therefore there is a need to prevent penetration of water from the interpixel insulating film as well as through the flattening insulating film (indicated by arrow 25 in FIG. 6). However, as is seen from the above description of the prior art, no measures have been taken against penetration of water through these paths in the above-described arrangement.

DISCLOSURE OF THE INVENTION

The present invention has been accomplished in consideration of the above-described problems, and it is an object of the present invention to prevent, in a display device having a display region formed by disposing a plurality of organic light emitting elements such as organic EL elements, penetration of water into the display region to suppress degradation in display characteristics even during drive over a long period of time and to improve long-term reliability.

According to the present invention, there is provided a display device comprising a display region having a plurality of organic light emitting elements disposed on a substrate, each of the plurality of organic light emitting elements having an organic layer comprising a light emitting layer interposed between an anode and a cathode, wherein the display region is formed on a first insulating protective layer provided on the substrate, and a surface on a side opposite to a substrate side of the display region and an entire periphery of the display region are covered with an insulating protective film (or coat).

In the present invention, it is preferred that a flattening insulating film with a substantially flat surface is disposed between the first insulating protective layer and the substrate; a second insulating protective layer is provided between the flattening insulating film and the substrate; and an entire periphery of the flattening insulating film is covered with an insulating protective film (or coat).

In the present invention, it is further preferred that at least one of the anode and the cathode is divided in a matrix form; an element-separating portion for isolating at least adjacent ones of the discrete electrodes is formed between the adjacent electrodes; and an element-separating portion covering layer is provided between the element-separating portion and the organic layer.

BEST MODE FOR CARRYING OUT THE INVENTION

The display device of the present invention will be described with reference to the drawings. However, the present invention is not limited to forms described below.

First Embodiment

Figure 1:
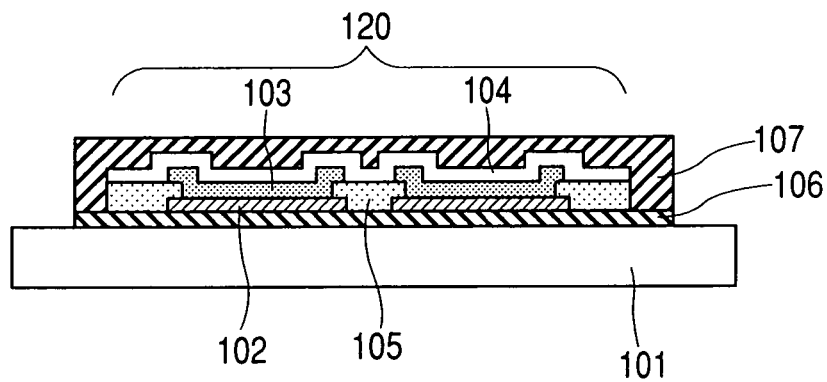
FIG. 1 is a schematic cross-sectional view showing a first embodiment of the present invention.

FIG. 1 shows a first embodiment of the present invention. In FIG. 1, a substrate on which TFTs, wiring, etc., (not shown) are formed is indicated by 101. Pixels (organic EL elements) constituting a display region 120 are constituted by pixel electrodes 102 (having electrical connections not shown in FIG. 1 to the TFTs) divided in a matrix form, organic layers 103 including light emitting layers constituting organic EL elements, a counter electrode 104, and element-separating portions 105 disposed between the pixel electrodes. In this embodiment, the counter electrode 104 is formed as a common electrode for all the organic EL elements.

In this embodiment, glass was used as the substrate, patterned Cr was disposed in a matrix form as the pixel electrodes provided as anodes of the organic EL elements, and ITO (indium-tin oxide) was used as the counter electrode provided as a cathode of the organic EL elements. An $SiO_2$ film was grown and patterned to form the element-separating portions. The materials of the substrate, the anode electrodes, the cathode electrode and the element-separating portions and the reversed positions of the anode and cathode are not essential to the present invention, and this combination is not exclusively used. For example, the inorganic insulating film of $SiO_2$ is used as the element-separating portions, however, SiN film may alternatively be used or an organic insulating film, e.g., a film of photosensitive polyimide or acrylic resin or a resin film having no photosensitivity may be used. A resin film having no photosensitivity is formed by etching and patterning with a resist patterning mask or the like. In a case where an organic resin film is used as the element-separating portions, use of such a film is made more effective if means for preventing penetration of water through the film is provided as described below.

In FIG. 1, a first insulating protective layer is indicated by 106 and an insulating protective film is indicated by 107. These films are provided in such a structure that the film 106 is formed below the pixel electrodes 102 and the element-separating portions 105, the film 107 is formed above the counter electrode 104, and the upper and lower surfaces and all the side surfaces of the display region 120 constituted by the plurality of organic EL elements are completely covered with these two protective films.

Figure 6:
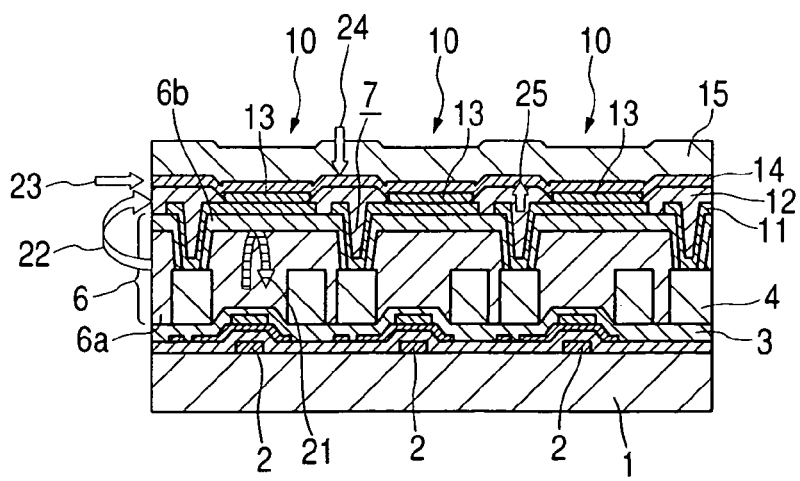
FIG. 6 is a schematic cross-sectional view of a conventional display device using organic EL elements.

The adoption of this arrangement made it possible to suppress penetration of water from contacting atmosphere surrounding the display region (in correspondence with arrows 23 and 24 in FIG. 6), to suppress penetration of water into the organic EL elements during drive over a long time period, and to prevent degradation of the organic EL element due to absorption of water.

Second Embodiment

Figure 2:
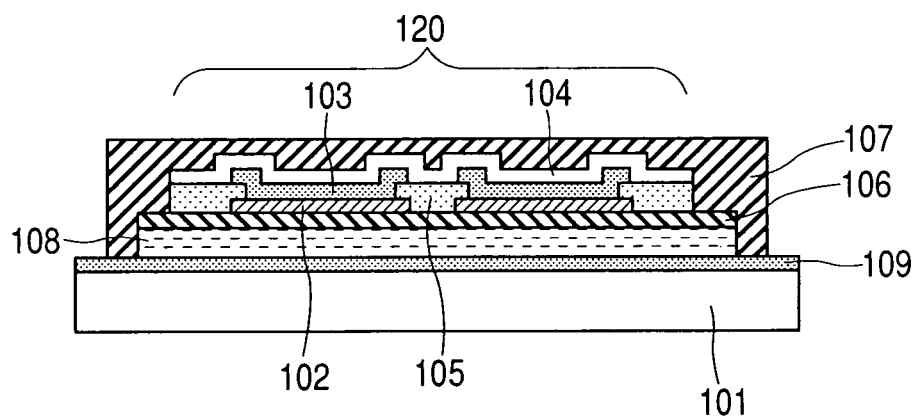
FIG. 2 is a schematic cross-sectional view showing a second embodiment of the present invention.

FIG. 2 shows a second embodiment of the present invention. The same reference characters indicate components equivalent in function to those shown in FIG. 1. In comparison with the first embodiment, this embodiment has a flattening insulating film 108 provided on the substrate 101 to reduce irregularities in the substrate surface. As the flattening insulating film, a film formed by applying a polyimide resin material spin coating as described with respect to an example of the conventional art was used.

In this embodiment, the first insulating protective layer 106 is formed between the flattening insulating film 108 and the display region 120 and a second insulating protective layer 109 as another insulating protective layer is formed between the flattening insulating film 108 and the substrate 101. The insulating protective film 107 formed on the counter electrode 104 is formed so as to cover peripheral areas of the display region 120 and end surfaces of the flattening insulating film 108.

The adoption of this arrangement made it possible to suppress penetration of water from contacting atmosphere surrounding the display region (indicated by arrows 23 and 24 in FIG. 6) and penetration of water released from the flattening insulating film end surfaces (indicated by arrow 22 in FIG. 6), to suppress penetration of water into the organic EL elements during drive over a long time period, and to prevent degradation of the organic EL element due to absorption of water.

The second insulating protective layer 109 was further formed between the flattening insulating film 108 and the substrate 101 to eliminate the influence of water, etc., on the elements including the TFTs formed on the substrate, thus improving the operation reliability.

Third Embodiment

Figure 3:
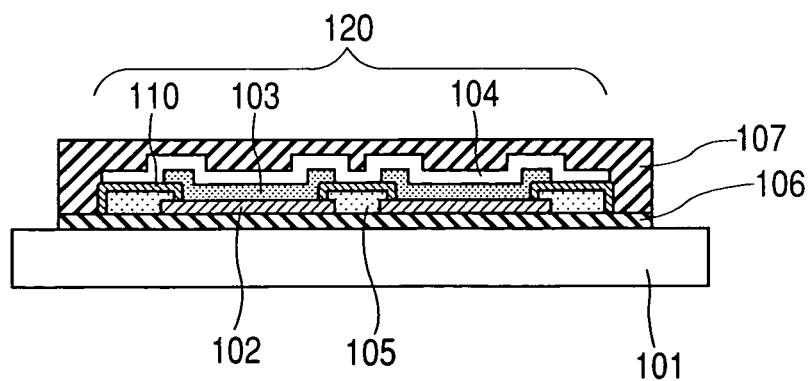
FIG. 3 is a schematic cross-sectional view showing a third embodiment of the present invention.

FIG. 3 shows a third embodiment of the present invention. The same reference characters indicate components equivalent in function to those shown in FIG. 1. In comparison with the first embodiment, this embodiment has an element-separating portion covering layer 110 provided on the upper surfaces of the element-separating portions 105.

The adoption of this arrangement made it possible to suppress penetration of water from contacting atmosphere surrounding the display region (indicated by arrows 23 and 24 in FIG. 6) and penetration of water released from the element-separating portion surfaces (indicated by arrow 25 in FIG. 6), to suppress penetration of water into the organic EL elements during drive over a long time period, and to prevent degradation of the organic EL element due to absorption of water.

Incidentally, in the case where an organic resin film is used as the element-separating portions and the element-separating portion covering layer in accordance with the present invention is provided, the element-separating portion covering layer may be provided at least between the element-separating portions and the organic layers. However, the device can easily be manufactured if it is provided in such a form that, as shown in FIG. 3, the electrodes 102 divided in a matrix form are disposed on the first insulating protective layer 106, the element-separating portions 105 are disposed so as to cover the gap between adjacent electrodes and portions of the divided electrodes to isolate adjacent electrodes from each other, and the element-separating portion covering layer is formed on the element-separating portions in a state of reaching the electrodes. Also, this form is preferable because of its effectiveness in preventing penetration into the organic layers of water contained in the element-separating portions.

Fourth Embodiment

Figure 4:
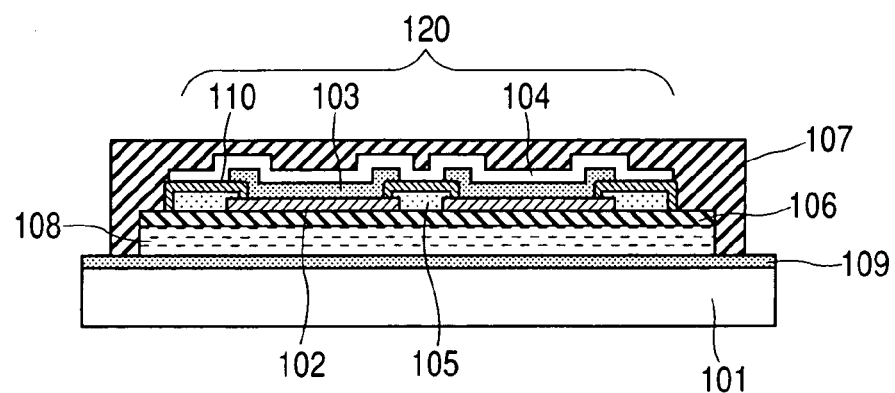
FIG. 4 is a schematic cross-sectional view showing a fourth embodiment of the present invention.
Figure 5:
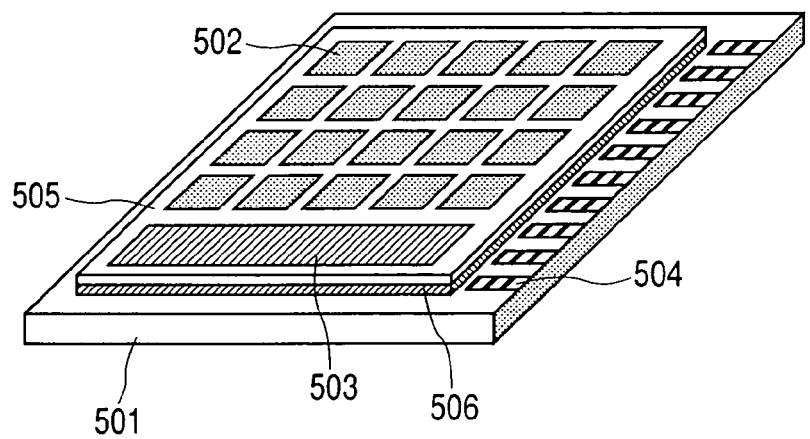
FIG. 5 is a schematic perspective view of an active-matrix organic EL display device.

FIG. 4 shows a fourth embodiment of the present invention. The same reference characters indicate components equivalent in function to those shown in FIG. 1. In comparison with the first embodiment, this embodiment has a flattening insulating film 108 provided on the substrate 101 to reduce irregularities in the substrate surface. As the flattening insulating film, a film formed by applying a polyimide resin material spin coating as described with respect to an example of the conventional art was used.

In this embodiment, the first insulating protective layer 106 is formed between the flattening insulating film 108 and the display region 120 and a second insulating protective layer 109 as another insulating protective layer is formed between the flattening insulating film 108 and the substrate 101. Further, the insulating protective film 107 formed on the counter electrode 104 is formed so as to cover peripheral areas of the display region 120 and end surfaces of the flattening insulating film 108. Further, the element-separating portion covering layers 110 are formed on the upper surfaces of the element-separating portions 105.

The adoption of this arrangement made it possible to suppress penetration of water from contacting atmosphere surrounding the display region (indicated by arrows 23 and 24 in FIG. 6), penetration of water released from the flattening insulating film end surfaces (indicated by arrow 22 in FIG. 6) and penetration of water released from the element-separating portion surfaces (indicated by arrow 25 in FIG. 6), to suppress penetration of water into the organic EL elements during drive over a long time period, and to prevent degradation of the organic EL element due to absorption of water.

The second insulating protective layer 109 was further formed between the flattening insulating film 108 and the substrate 101 to eliminate the influence of water, etc., on the elements including the TFTs formed on the substrate, thus improving the operation reliability.

In the above-described first to fourth embodiments, films such as the first insulating protective layer 106, the insulating protective film 107 and the element-separating portion covering layer 110 were formed in such a form as to contact the pixel electrodes 102, the organic layers 103 and the element-separating portions 105 that form the display region. However, an insulating film with no possibility (or an extremely low possibility) of releasing water, e.g., an inorganic insulating film may exist between these layers.

Although in the above-described embodiments the second insulating protective film 109 formed in a region below the flattening insulating film 108 was formed in such a form as to contact the flattening insulating film 108, the present invention is not limited to the above-described form as long as the flattening insulating film 108 is covered.

In the display device of the present invention, it is preferable to adopt an arrangement in which the display region is covered with a transparent member such as a glass member to maintain a mechanical strength. In such a case, the transparent member such as a glass member may be bonded to the substrate with a suitable space left therebetween or may be directly bonded to the insulating protective film 107. In the case of direct bonding, the influence of penetration of water from external air shown in FIG. 6 (by arrow 24) can be further reduced.

As the first insulating protective layer 106, insulating protective film 107, second insulating protective layer 109 and element-separating portion covering layer 110 of the present invention, an inorganic material such as silicon oxide, silicon nitride ($Si_3N_4$), amorphous silicon (α-Si) or aluminium oxide ($Al_2O_3$) can be favorably used.

With the display device of the present invention, as described above with respect to the embodiments, a display region constituted by organic light emitting elements such as organic EL elements is covered with insulating protective films for preventing penetration of water to suppress degradation of display characteristics during drive over a long time period and to improve long-term reliability.

The invention claimed is:

1. A top emission display device comprising in sequence:
   (a) a substrate;
   (b) an insulating layer;
   (c) a display region comprising a plurality of organic EL elements and an element separating portion between adjacent organic EL elements, each said organic EL element comprises, in sequence, beginning from the insulating layer, (i) a lower electrode, (ii) an organic compound layer and (iii) a light extraction side upper electrode, said lower electrode and light extraction side upper electrode sandwiching said organic compound layer, said element separating portion covering a part of the lower electrode; and
   (d) a protective layer covering the organic EL element, wherein the organic EL element is surrounded by the insulating layer and the protective layer.

2. The display device according to claim 1, wherein an end of the protective layer is in contact with the insulating layer.

3. The display device according to claim 1 wherein the insulating layer is in contact with the lower electrode.

4. The display device according to claim 1, wherein the insulating layer is not provided at an edge of the substrate.

5. The display device according to claim 1, wherein the protective layer is provided extending outside the insulating layer.

6. The display device according to claim 1, wherein the organic EL element is connected to a TFT.

7. The display device according to claim 1, wherein the upper electrode is ITO.

8. The display device according to claim 1, wherein the element separating portion is SiN.

9. The display device according to claim 1, wherein the element separating portion is polyamide or acrylic resin.

10. The display device according to claim 1, further comprising an element separating portion covering layer which covers the element separating portion.

11. The display device according to claim 1, further comprising, between the substrate and the insulating layer, a flattening insulating film and a second insulating layer.

* * * * *

UNITED STATES PATENT AND TRADEMARK OFFICE
CERTIFICATE OF CORRECTION

PATENT NO. : 7,321,194 B2
APPLICATION NO. : 10/530896
DATED : January 22, 2008
INVENTOR(S) : Shigeki Kondo et al.

Page 1 of 1

It is certified that error appears in the above-identified patent and that said Letters Patent is hereby corrected as shown below:

ON TITLE PAGE [75] INVENTORS:

Inventors, "Seishi Miura, Sagamihra (JP);" should read --Seishi Miura, Sagamihara (JP);--.

Signed and Sealed this

Twenty-fourth Day of March, 2009

JOHN DOLL
*Acting Director of the United States Patent and Trademark Office*